United States Patent
Gotou

(10) Patent No.: US 10,496,762 B2
(45) Date of Patent: Dec. 3, 2019

(54) MODEL GENERATING DEVICE, POSITION AND ORIENTATION CALCULATING DEVICE, AND HANDLING ROBOT DEVICE

(71) Applicant: FANUC CORPORATION, Yamanashi (JP)

(72) Inventor: Takefumi Gotou, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 51 days.

(21) Appl. No.: 15/381,671

(22) Filed: Dec. 16, 2016

(65) Prior Publication Data
US 2017/0177746 A1 Jun. 22, 2017

(30) Foreign Application Priority Data
Dec. 17, 2015 (JP) ................................. 2015-246029

(51) Int. Cl.
*G06F 17/50* (2006.01)
*B25J 9/16* (2006.01)

(52) U.S. Cl.
CPC ............ *G06F 17/50* (2013.01); *B25J 9/1697* (2013.01); *G06F 17/5086* (2013.01);
(Continued)

(58) Field of Classification Search
None
See application file for complete search history.

(56) References Cited

U.S. PATENT DOCUMENTS 6,721,444 B1 * 4/2004 Gu .................... B25J 9/1697
   345/419
2002/0006217 A1 * 1/2002 Rubbert ................. A61C 7/00
   382/131

(Continued)

FOREIGN PATENT DOCUMENTS

| CN | 101394780 A | 3/2009 |
| CN | 103873751 A | 6/2014 |

(Continued)

OTHER PUBLICATIONS

Ruhnke, M., Steder, B., Grisetti, G., & Burgard, W. (May 2009). Unsupervised learning of 3d object models from partial views. In Robotics and Automation, 2009. ICRA'09. IEEE International Conference on (pp. 801-806). IEEE. (Year: 2009).*

(Continued)

*Primary Examiner* — Bijan Mapar
(74) *Attorney, Agent, or Firm* — Hauptman Ham, LLP

(57) ABSTRACT

A model generating device for generating a three-dimensional model of an object includes a three-dimensional measuring machine which three-dimensionally measures a plurality of objects each disposed at a given orientation in a three-dimensional space, to obtain measurement data, a model measurement data extracting unit which treats the measurement data of the plurality of objects measured by the three-dimensional measuring machine as a set of model measurement data obtained by measuring one object from a plurality of virtual measurement positions, to extract the model measurement data corresponding to the plurality of virtual measurement positions, and a model measurement data integrating unit which integrates the model measurement data extracted by the model measurement data extracting unit, to generate a three-dimensional model of each object.

19 Claims, 8 Drawing Sheets

(52) U.S. Cl.
CPC .......... *G05B 2219/39527* (2013.01); *G05B 2219/39543* (2013.01); *G05B 2219/40053* (2013.01)

(56) References Cited

U.S. PATENT DOCUMENTS

2004/0014187 A1  1/2004  Springer et al.
2010/0111364 A1  5/2010  Iida et al.

FOREIGN PATENT DOCUMENTS

| | | |
|---|---|---|
| CN | 104266609 A | 1/2015 |
| DE | 19852149 A1 | 5/2000 |
| DE | 102008023264 A1 | 11/2009 |
| JP | 2003-302211 A | 10/2003 |
| JP | 2005-189203 A | 7/2005 |
| JP | 2010-79453 A | 4/2010 |
| JP | 2010-113398 A | 5/2010 |
| JP | 2013-130535 A | 7/2013 |
| WO | 2014/178050 A2 | 11/2014 |

OTHER PUBLICATIONS

Nikolaus Schön and Gerd Häusler, "Automatic coarse registration of three-dimensional surfaces by information theoretic selection of salient points", Applied Optics vol. 45 No. 25, pp. 6539-6550 Sep. 1, 2016, 12 pp.

* cited by examiner

MODEL GENERATING DEVICE, POSITION AND ORIENTATION CALCULATING DEVICE, AND HANDLING ROBOT DEVICE

RELATED APPLICATIONS

The present application claims priority to Japanese Patent Application Number 2015-246029 filed Dec. 17, 2015, the disclosure of which is hereby incorporated by reference herein in its entirety.

BACKGROUND OF THE INVENTION

1. Field of the Invention

The present invention relates to a model generating device which measures a target object using a three-dimensional measuring machine, and generates a three-dimensional model of the target object using the measurement data. The present invention also relates to a position and orientation calculating device for calculating a position and orientation of the target object based on the three-dimensional model and the measurement data of the target object. The present invention also relates to a handling robot device which calculates a position and orientation of the target object based on the three-dimensional model and the measurement data of the target object, and handles the target object using a robot based on the calculated position and orientation of the target object.

2. Description of the Related Art

In a device which checks data measured by a three-dimensional measuring machine against a three-dimensional model, to calculate a position and orientation of a target object (hereinafter may be referred to as "object"), the three-dimensional model of, for example, the target object should be previously generated. The three-dimensional model is generated mainly by the following two methods.

In a first method, CAD data of a target object are used. Japanese Unexamined Patent Publication (Kokai) No. 2010-079453 discloses a technology for generating a three-dimensional model for estimation of position and orientation from the CAD data. In Japanese Unexamined Patent Publication (Kokai) No. 2010-079453, measurement data, which can be expected to be acquired from the CAD data when the target object is three-dimensionally measured, are generated, and then the three-dimensional model for estimation of position and orientation is generated based on the generated measurement data.

In a second method, a target object is actually measured by a three-dimensional measuring machine, and then a three-dimensional model is generated. However, a general three-dimensional measuring machine measures only a surface of an object, which is exposed to the upper side. Thus, in order to calculate positions and orientations of various objects, each object should be previously measured from various perspectives. In Japanese Unexamined Patent Publication (Kokai) No. 2010-113398, a three-dimensional measurement and a calculation of position and orientation are repeated while the orientation of an object is gradually changed, and then a three-dimensional model of the object is generated by integrating the measurement data based on the calculated position and orientation.

SUMMARY OF THE INVENTION

However, the aforementioned conventional methods have the following problems.

In the method disclosed in Japanese Unexamined Patent Publication (Kokai) No. 2010-079453, CAD data should be previously prepared. The CAD data of a target object are not always available, and accordingly, a three-dimensional model cannot be generated in such a case. Further, all surfaces of the object cannot always be three-dimensionally measured in accordance with expectation. The three-dimensional measuring machine sing an optical system is difficult to three-dimensionally measure a surface region having a specific property, e.g., a partial black region on the surface of the object. However, when the three-dimensional model is generated from the CAD data, such a surface property cannot be taken into consideration. If such a surface property is modeled, some errors in modeling and a gap between the generated three-dimensional model and the actual measurement data would occur.

In the method disclosed in Japanese Unexamined Patent Publication (Kokai) No. 2010-113398, a three-dimensional measurement and a calculation of position and orientation should be repeated every time the orientation of the object is changed little by little. When, for example, a rotating body, such as a cam shaft, is measured every time it is rotated around its axis by 20 degrees, the measurement should be performed eighteen times in total. Further, when a three-dimensional model, based on which all positions and orientations of an object, including positions and orientations around the axis of the object, can be calculated, is generated, the number of measuring operations reaches a huge number, and the time and effort for creating the three-dimensional model drastically increase in proportion to this huge number of measuring operations. Thus, an enormous amount of time is needed to create the three-dimensional model.

The present invention was made in light of the circumstances described above and has an object to provide a model generating device which can easily generate a three-dimensional model of a target object having no CAD data by one or several measurements performed by a three-dimensional measuring machine, and a position and orientation calculation device including such a model generating device and a handling robot device.

To achieve the above object, according to a first aspect of the invention, there is provided a model generating device for generating a three-dimensional model of an object. The model generating device includes a three-dimensional measuring machine which three-dimensionally measures a plurality of objects each disposed at a given orientation in a three-dimensional space, to obtain measurement data, a model measurement data extracting unit which treats the measurement data of the plurality of objects measured by the three-dimensional measuring machine as a set of model measurement data obtained by measuring one object from a plurality of virtual measurement positions, to extract the model measurement data corresponding to the plurality of virtual measurement positions, and a model measurement data integrating unit which integrates the model measurement data extracted by the model measurement data extracting unit, to generate a three-dimensional model of each object.

According to a second aspect of the invention, in the model generating device according to the first aspect of the invention, the model measurement data extracting unit includes a depiction part for outputting the measurement data on a teaching screen, a region setting part for setting a region of one object selected from the plurality of objects on the teaching screen on which the measurement data are output, a temporary model generating part for generating a temporary model based on measurement data which are present within the region set by the region setting part, and a detection part for detecting positions and orientations of the remaining objects of the plurality of objects using the temporary model. The model measurement data extracting unit extracts model measurement data based on the positions and orientations of the remaining objects detected by the detection part. The model measurement data integrating unit integrates the model measurement data into the temporary model, to generate a three-dimensional model.

According to a third aspect of the invention, in the model generating device according to the second aspect of the invention, the detection part detects objects in order from one of the objects, which has an orientation most close to an initial orientation of the temporary model. The model measurement data extracting unit extracts model measurement data from objects in order from one of the objects, which has an orientation most close to an initial orientation of the temporary model, based on detection results of the detection part. The model measurement data integrating unit successively integrates the model measurement data into the temporary model every time the model measurement data are extracted.

According to a fourth aspect of the invention, in the model generating device according to the second or third aspect of the invention, the model measurement data extracting unit includes a detection success and failure instructing part by which an operator instructs success and failure of the detection results of the detection part.

According to a fifth aspect of the invention, in the model generating device according to any of the second to fourth aspects of the invention, the model measurement data extracting unit extracts the model measurement data based on the measurement data in the vicinity of the position and orientation of the object detected by the detection part.

According to a sixth aspect of the invention, in the model generating device according to any of the second to fifth aspects of the invention, even when the model measurement data extracting unit incorrectly extracts wrong measurement data as model measurement data, and the model measurement data integrating unit integrates the incorrectly extracted incorrect model measurement data into the temporary model, the model measurement data integrating unit comprises an incorrect model measurement data removing part for extracting and removing the incorrect model measurement data from the temporary model based on consistency between the measurement data and the temporary model.

According to a seventh aspect of the invention, in the model generating device according to any of the second to sixth aspects of the invention, when the model measurement data integrating unit integrates the model measurement data into the temporary model, if there is an overlapped portion between the model measurement data and the temporary model, after the overlapped portion is removed from the model measurement data, the model measurement data are integrated into the temporary model.

According to an eighth aspect of the invention, in the model generating device according to any of the second to sixth aspects of the invention, when the model measurement data integrating unit integrates the model measurement data into the temporary model, if there is an overlapped portion between the model measurement data and the temporary model, the overlapped portion of the temporary model is updated based on the overlapped portion of the model measurement data.

According to a ninth aspect of the invention, in the model generating device according to any of the first to eighth aspects of the invention, the model measurement data integrating unit performs optimization using, as a parameter, at least one of the virtual measurement position calculated from the position and orientation of the object detected by the detection part or the model measurement data, to improve the accuracy of a model to be generated.

According to a tenth aspect of the invention, in the model generating device according to any of the first to ninth aspects of the invention, the three-dimensional measuring machine performs, one or more times, a process in which, after a plurality of objects disposed in a three-dimensional space are three-dimensionally measured, the loading condition of the objects is changed, and the objects are newly three-dimensionally measured, the model measurement data extracting unit and the model measurement data integrating unit generate a three-dimensional model of each object based on a plurality of measurement data obtained by performing a three-dimensional measurement two or more times.

According to an eleventh aspect of the invention, there is provided a position and orientation calculating device including a model generating device according to any of the first to tenth aspects of the invention, and a position and orientation calculating unit for calculating positions and orientations of the objects based on the correspondence between the three-dimensional model generated by the model generating device and the measurement data obtained by the three-dimensional measuring machine.

According to a twelfth aspect of the invention, there is provided a handling robot device including a robot capable of handling the objects, a model generating device according to any of the first to tenth aspects of the invention, and a position and orientation calculating unit for calculating positions and orientations of the objects based on the correspondence between the three-dimensional model generated by the model generating device and the measurement data obtained by the three-dimensional measuring machine. The robot handles the objects based on positions and orientations of the objects, which are calculated by the position and orientation calculating unit.

These objects, features, and advantages of the present invention and other objects, features, and advantages will become further clearer from the detailed description of typical embodiments illustrated in the appended drawings.

DETAILED DESCRIPTION

Figure 1:
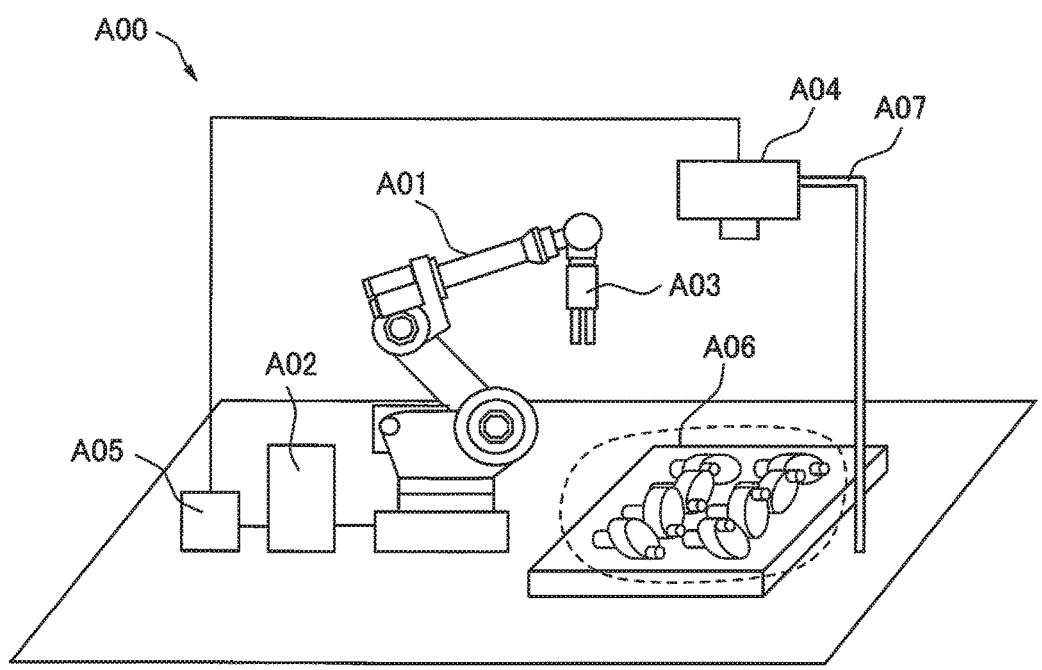
FIG. 1 is a schematic view of a handling robot device according to the present invention.

Embodiments of the present invention will be described below with reference to the accompanying drawings. In the following figures, similar members are designated with the same reference numerals. These figures are properly modified in scale to assist the understanding thereof.

FIG. 1 is a schematic view of a handling robot device according to the present invention. As shown in FIG. 1, a handling robot device A00 mainly includes a robot A01, a robot control device A02 for controlling the robot A01, a hand A03 attached to a tip end of an arm of the robot A01, a three-dimensional measuring machine A04, and a three-dimensional recognition device A05.

As shown in FIG. 1, the three-dimensional measuring machine A04 is secured to a tip end of a cradle A07. A plurality of objects A06 of the same type or the same shape are randomly placed within a measuring range of the three-dimensional measuring machine A04. Alternatively, the objects A06 may be each disposed at a given orientation in a three-dimensional space. The three-dimensional measuring machine A04 measures surfaces of the randomly placed objects A06, and acquires, as measurement data, the positional information of a plurality of three-dimensional points.

The hand A03 grasps and releases one of the objects A06, and is controlled by the robot control device A02. Note that the three-dimensional measuring machine A04 may be attached to the tip end of the robot A01.

The three-dimensional measuring machine A04 can use various non-contact methods for measuring the objects A06. Examples of such methods include a stereo method using two cameras, a method for scanning using a laser slit light, a method for scanning using a laser spot light, a method for projecting pattern light on an object using a device, for example, an projector, and a method using a flying time from when light is emitted from a phototransmitter to when the light is reflected from a surface of an object and then enters a photoreceiver.

As can be seen from FIG. 1, the three-dimensional measuring machine A04 and the three-dimensional recognition device A05 are connected so as to communicate with each other by a communication unit, such as a communication cable. Likewise, the three-dimensional recognition device A05 and the robot control device A02 are connected so as to communicate with each other by a communication unit, such as a communication cable. Note that the robot control device A02 may have a function as the three-dimensional recognition device A05, so that the robot control device A02 generates a three-dimensional model B40 or calculates object's position and orientation B50.

Figure 2:
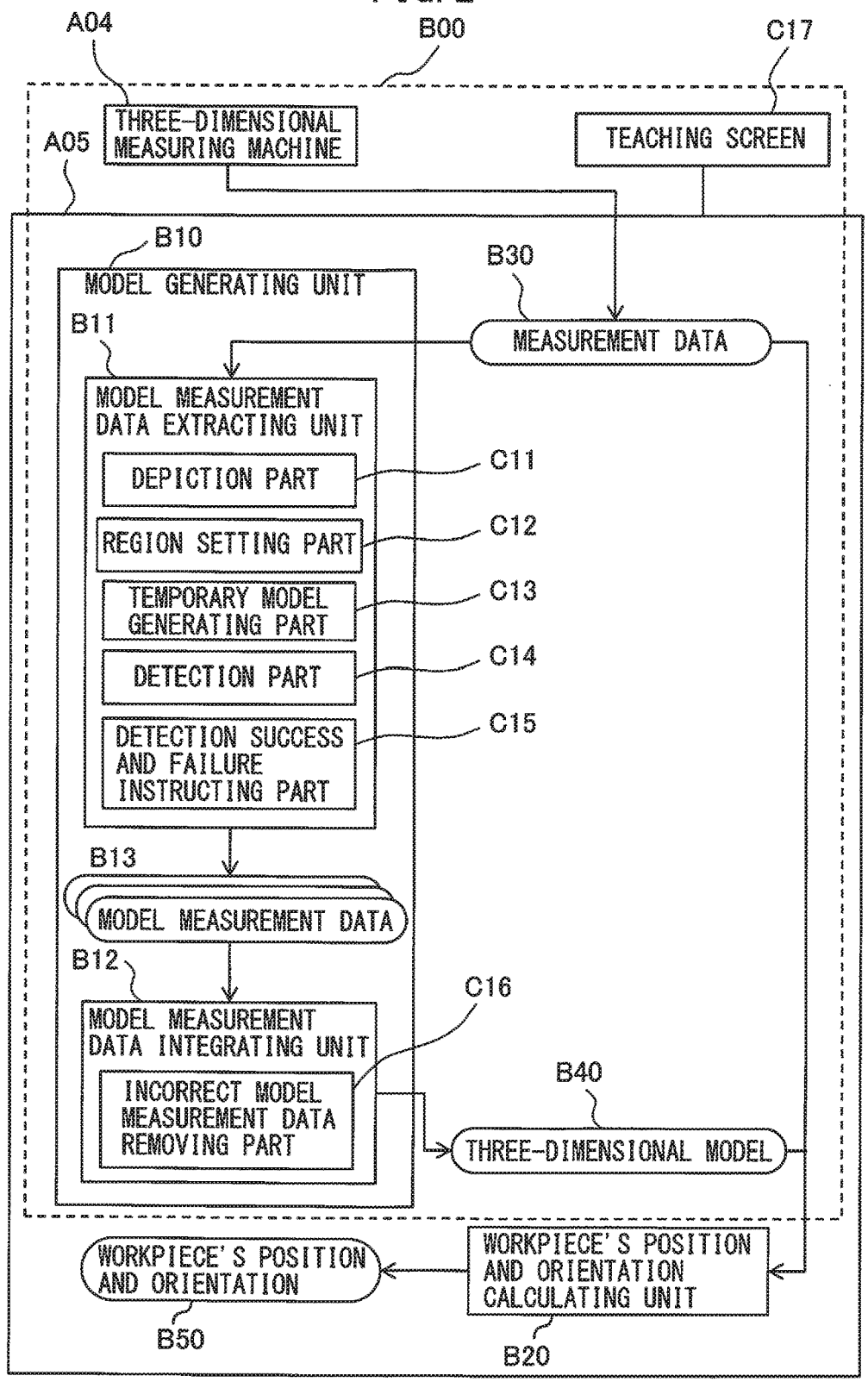
FIG. 2 is a block diagram of the function of a three-dimensional recognition device including a model generating device according to the present invention.

FIG. 2 is a block diagram of the function of a three-dimensional recognition device including a model generating device according to the present invention. Strictly speaking, a portion B00 designated by a broken line in FIG. 2 corresponds to the model generating device according to the present invention. A model generating unit B10 shown in FIG. 2 includes a model measurement data extracting unit B11, which treats measurement data of a plurality of objects measured by the three-dimensional measuring machine A04 as a set of model measurement data obtained by measuring one object from a plurality of virtual measuring positions, and extracts model measurement data corresponding to the virtual measuring positions, and a model measurement data integrating unit B12, which generates a three-dimensional model of each object by integrating the model measurement data extracted by the model measurement data extracting unit B11.

As shown in FIG. 2, the model measurement data extracting unit B11 includes a depiction part C11 for outputting measurement data on a teaching screen C17, a region setting part C12 for setting a region of one object selected from the objects on the teaching screen on which the measurement data are output, a temporary model generating part C13 for generating a temporary model based on the measurement data within the region set by the region setting part C12, and a detection part C14 for detecting positions and orientations of the remaining objects in the objects, using the temporary model. The model measurement data extracting unit B11 is provided with a detection success and failure instructing part C15 by which an operator instructs success and failure of detection made by the detection part C14.

The model measurement data integrating unit B12 includes a wrong model measurement data removing part C16, which extracts and removes wrong model measurement data from the temporary model based on the consistency of the measurement data with the temporary model even when the model measurement data extracting unit B11 incorrectly extracts wrong measurement data as model measurement data, and the model measurement data integrating unit B12 integrates the wrong model measurement data, which has been incorrectly extracted, into the temporary model.

Figure 3:
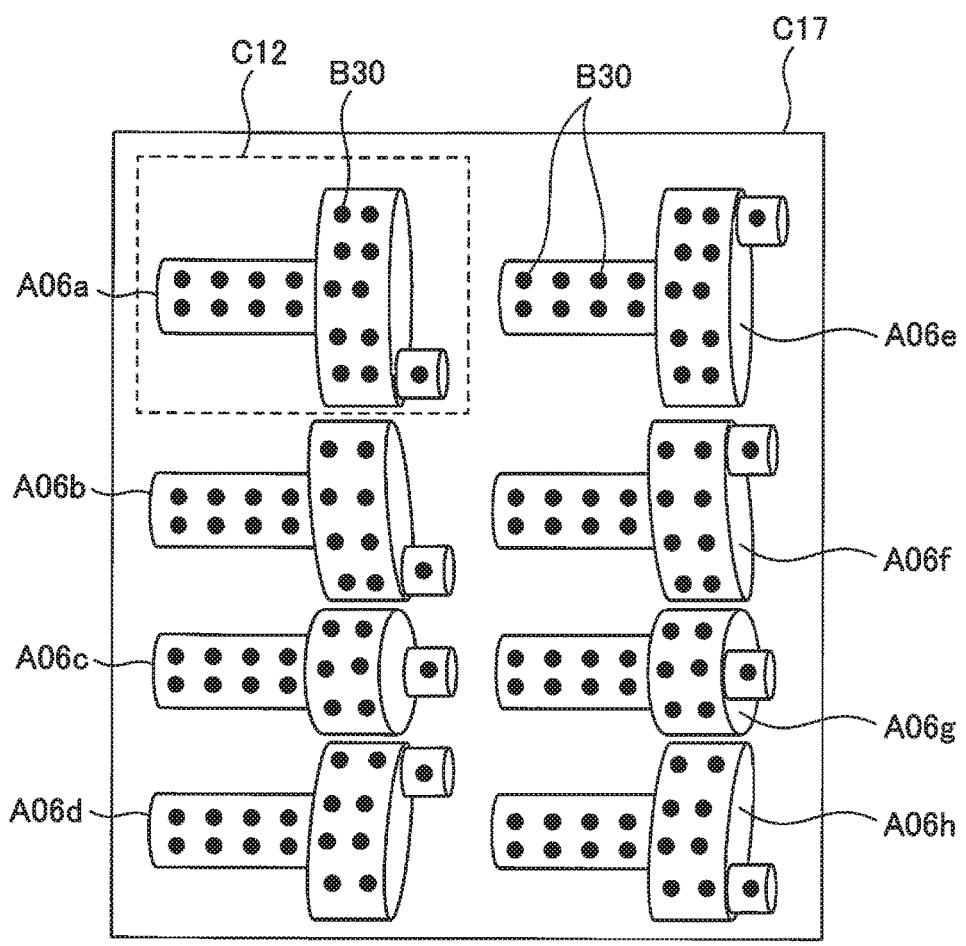
FIG. 3 is an explanatory view of measurement data.

As can be seen from FIG. 2, the three-dimensional measuring machine A04 acquires measurement data B30 of the objects A06. FIG. 3 is an explanatory view of measurement data. FIG. 3 shows objects A06a to A06h. In an example shown in FIG. 3, the objects A06a to A06h each have a shaft part, a flange part having an oval shape, which is attached to an end of the shaft part, and a protrusion part which is attached to the vicinity of the peripheral surface of the flange part and which extends in a direction opposite to the direction toward the flange part.

In order to facilitate understanding, the objects A06a to A06h in FIG. 3 are arranged so that their shaft parts are generally directed in the same direction, and their flange parts are positioned at different rotational positions around the shaft parts. Of course, actually, the objects A06a to A06h may be randomly placed, and may have different positions and orientations. Alternatively, the objects A06 may have another shape.

Further, a plurality of black dots are illustrated on the surfaces of the objects A06. The black dots shown in FIG. 3 correspond to the measurement data B30 representing the positional information of three-dimensional points on the surfaces of the objects A06, which are measured by the three-dimensional measuring machine A04. The model generating unit B10 shown in FIG. 2 uses the measurement data B30, to generate the three-dimensional model B40 of each object, as will be described later.

As can be seen from FIG. 3, the measurement data B30 are acquired from the surface of one object, e.g., the object A06a, which faces upward. Even in an object having another orientation, e.g., the object A06b, the measurement data B30 are acquired from the surface facing upward, but the acquired data includes information of a blind area in the object A06a. Thus, the measurement data B30 obtained by simultaneously measuring the objects A06a to A06h can be counted as including information obtained by measuring one object from various virtual measuring positions.

Figure 4:
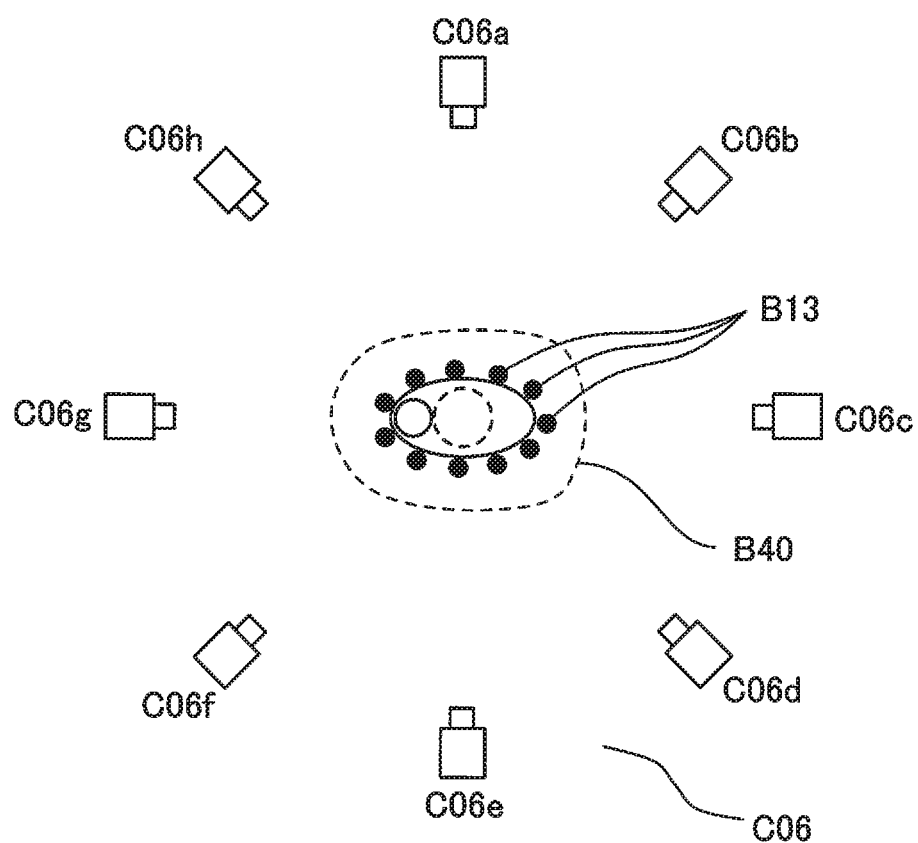
FIG. 4 is an explanatory view of virtual measurement positions.

The virtual measuring positions will be described in more detail using FIG. 4. FIG. 4 shows virtual measuring positions C06a to C06h. The virtual measuring positions C06a to C06h correspond to virtual measuring positions to be calculated when a reference coordinate system is applied to one of the objects A06 based on the relative positional relationship between the objects A06a to A06h shown in FIG. 3 and the measuring positions.

In the present invention, the measurement data B30 of the objects A06a to A06h shown in FIG. 3 are treated as a set of measurement data (hereinafter referred to as model measurement data B13) obtained by measuring one of the objects A06 from the virtual measuring positions C06a to C06h shown in FIG. 4.

Referring again to FIG. 2, the model measurement data extracting unit B11 extracts the model measurement data B13, which are measured from one of the virtual measuring positions C06, from the measurement data B30 as will be described below. Further, the model measurement data integrating unit B12 integrates the model measurement data B13 based on a plurality of virtual measuring positions, and thus, the three-dimensional model B40 of each object is generated.

Figure 5:
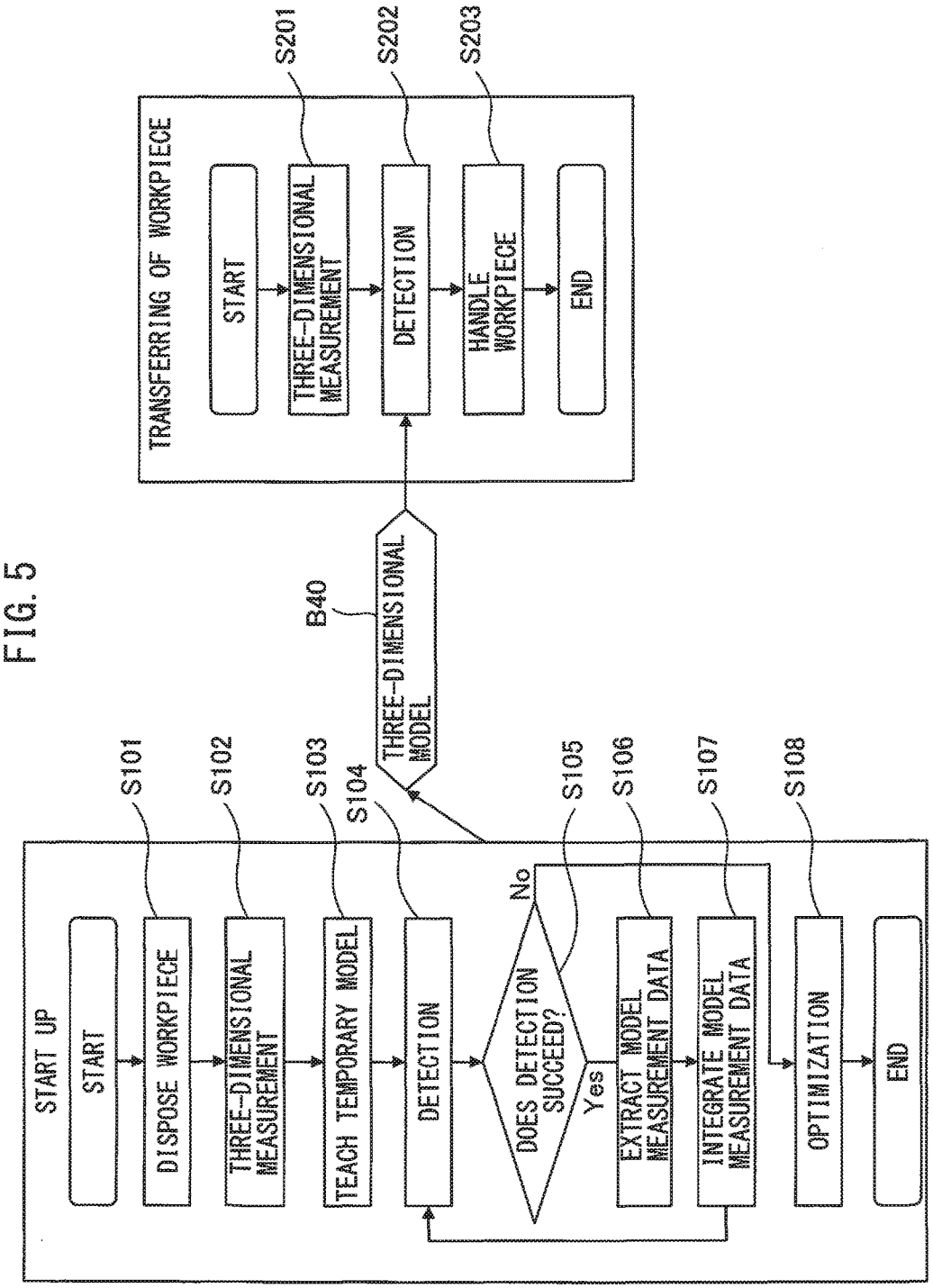
FIG. 5 is a flowchart of the operation of a handling robot device.

FIG. 5 is a flowchart of the operation of a handling robot device. The process executed in the handling robot device A00 shown in FIG. 1 will be described below with reference to FIG. 5. When the handling robot device A00 starts up, as shown on the left side of FIG. 5, the three-dimensional measuring machine A04 is used to generate the three-dimensional model B40.

In step S101 of FIG. 5, a plurality of objects A06 are randomly placed within a measuring range of the three-dimensional measuring machine A04 as described above. In this respect, it is preferable that the objects A06 have various orientations. Such a case can be determined to be similar to a case in which one of the objects A06 is measured from various measuring positions, and accordingly, a reliable three-dimensional model can be generated. After the objects A06 are randomly placed, the process shifts to step S102.

In step S102, the surfaces of the randomly placed objects A06 are measured by the three-dimensional measuring machine A04. The measurement data B30 (refer to FIG. 3) acquired by the three-dimensional measuring machine A04 are maintained in the three-dimensional recognition device A05. After the acquisition of the measurement data B30 is complete, the process shifts to step S103.

In step S103, the depiction part C11 outputs the measurement data B30 on the teaching screen C17. In this instance, as shown in FIG. 3, it is preferable that images of the objects A06a to A06h captured by the three-dimensional measuring machine A04 or another image capturing unit, to which the measurement data B30 are superimposed, are displayed.

Subsequently, an operator sets a region surrounding one of the objects A06a to A06h using the region setting part C12. FIG. 3 shows a region surrounding the object A06a, which is set by the region setting part C12.

Figure 6A:
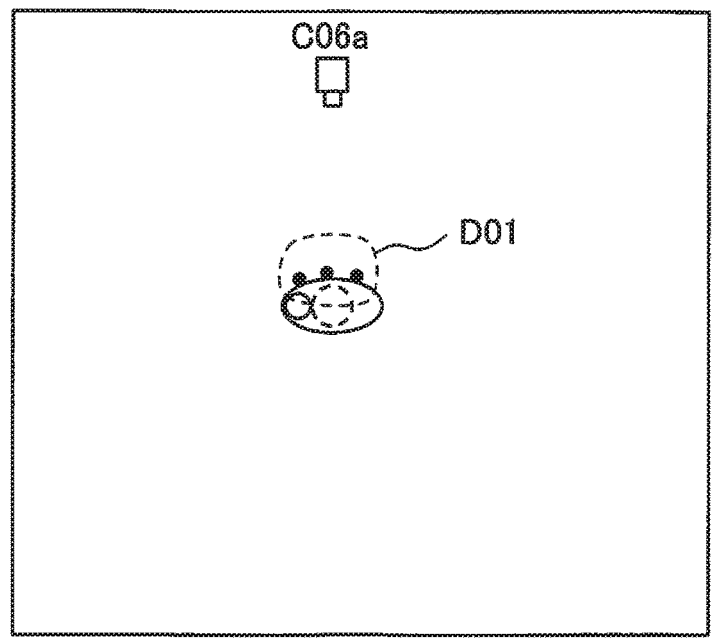
FIG. 6A is a first explanatory view of a temporary model.

Subsequently, the temporary model generating part C13 generates a temporary model D01 based on the measurement data B30 within the set region of the object A06a. In FIG. 6A, the temporary model D01 is generated based on the model measurement data B13 measured from the virtual measuring position C06a corresponding to the object A06a. Note that the black dots shown in FIGS. 6A to 6D are the model measurement data B13, and a set of the black dots shown in FIGS. 6A to 6D is the temporary model D01.

In this embodiment, any method for teaching the temporary model D01 can be adopted. For example, points obtained by projecting three-dimensional points on a camera image are plotted to teach three-dimensional points useful for, for example, area definition or mask teaching. When the teaching of the temporary model D01 is complete, the process shifts to step S104.

In step S104, the detection part C14 checks the temporary model D01 against the measurement data B30, which are not used in step S103, to detect the remaining objects A06, specifically, the positions and orientations of the remaining objects. As shown in, for example, FIG. 6B, the detection part C14 sequentially detects different positions and orientations of an object, which correspond to virtual measuring positions close to the virtual measuring position C06a, for example, the measuring positions C06b and C06h.

When the detection part C14 succeeds in detection in step S105, the process shifts to step S106. In step S106, the model measurement data B13 measured from the virtual measuring positions C06 corresponding to the detection results are extracted based on the detection results. Specifically, first, the coordinates of the temporary model D01 at that point of time are converted based on the position and orientation of the object calculated by the detection.

If there are three-dimensional points in the measurement data B30, which are close to any of the three-dimensional points of the temporary model D01 whose coordinates have been converted, these three-dimensional points are extracted as new model measurement data B13. Specifically, a distance between each three-dimensional point in the temporary model D01 and the corresponding three-dimensional point in the measurement data B30 is calculated. When the calculated distance is smaller than a predetermined threshold value, the three-dimensional points in the measurement data B30 are extracted as model measurement data.

In the meantime, if there is an erroneous detection in step S104, and a result of the erroneous detection is used to generate a three-dimensional model, a final three-dimensional model would be erroneously generated. Thus, an operator should confirm that the detection result is correct, and should prevent the incorrect detection result from being used, by the detection success and failure instructing part C15. It is preferable that only the detection result, which is guaranteed to be correct, is used to execute steps S106 and S107. This eliminates incorrect detection results, and accordingly, incorrect model measurement data B13 can be prevented from being added to the three-dimensional model. Note that, when the extraction of the model measurement data B13 is complete, the process shifts to step S107.

In step S107, the extracted model measurement data B13 are integrated into the temporary model D01. In this respect, there is an overlapped portion between the newly extracted model measurement data B13 and the temporary model D01. Thus, if all the newly extracted model measurement data B13 are integrated each time, the data of the final three-dimensional model will be redundant and extremely heavy.

Thus, when a three-dimensional model is generated, it is preferable that data are integrated so as to have an appropriate amount of information. In order to achieve this kind of integration, the following two methods can be adopted.

In a first method, when there have been already three-dimensional points in the temporary model D01 in the vicinity of the three-dimensional points in the newly extracted model measurement data B13, these three-dimensional points are removed from the newly extracted model measurement data B13, and are prevented from being integrated into the temporary model.

In a second method, when there have been already three-dimensional points in the temporary model D01 in the vicinity of the three-dimensional points in the newly extracted model measurement data B13, one new three-dimensional point is calculated from the three-dimensional points in the newly extracted model measurement data B13 and the three-dimensional points in the temporary model D01. For example, the new three-dimensional point may be a gravity center of the three-dimensional points in the newly extracted model measurement data B13 and the three-dimensional points in the temporary model D01. In this instance, a model, in which measuring errors are relaxed, can be generated.

Figure 7:
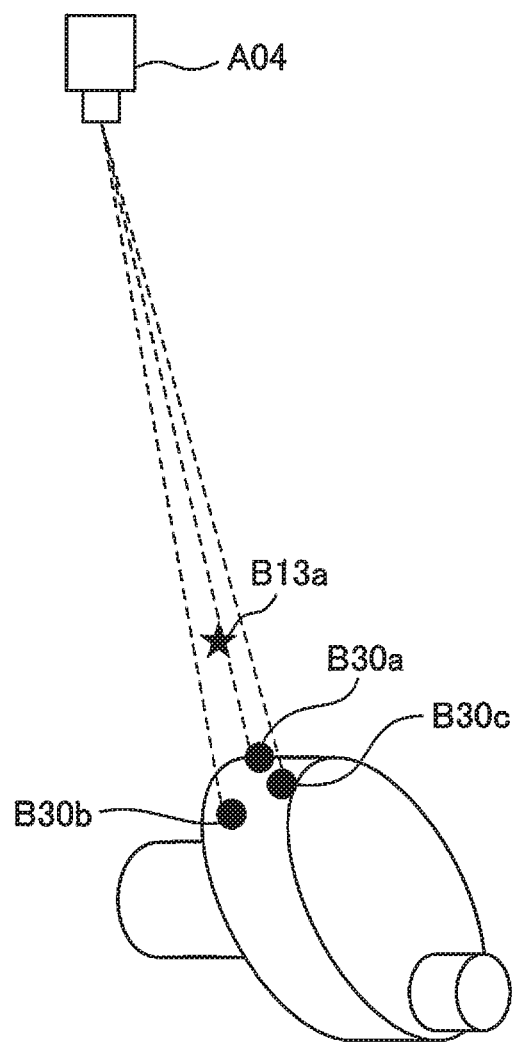
FIG. 7 is an explanatory view of removal of incorrect model measurement data.

FIG. 7 is an explanatory view of removal of incorrect model measurement data. In FIG. 7, three three-dimensional points B30a to B30c are acquired, as the measurement data B30, for one object. When the three-dimensional points B30a to B30c define a triangle patch by a general triangle patch generating method, it can be expected that there is no object within a triangular pyramid defined by four points, i.e., the three-dimensional measuring machine A04 and the three-dimensional points B30a to B30c. Thus, if there is a model measurement datum B13a within the triangular pyramid, the model measurement datum B13a is determined to be an incorrect one of the model measurement data B13, and thus, is removed by the wrong model measurement data removing part C16.

Thus, even when wrong three-dimensional points are extracted as the model measurement data B13, wrong model measurement data B13 can be removed by confirming the consistency with the measurement data B30. Thus, in the present invention, a correct three-dimensional model can be generated.

Note that a method for teaching a region having no model measurement data on a camera image or a teaching screen with voxel display function is also effective. When the integration of the model measurement data is complete, the process returns to step S104. Then the process in steps S104 to S107 is repeated using an updated temporary model D01.

In this respect, it is impossible to detect the model measurement data measured from a measuring position far from the virtual measuring position C06a, at which the temporary model D01 shown in FIG. 6A is initially registered, for example, the virtual measuring position C06e shown in FIG. 4, using the initial temporary model D01, or the accuracy of this detection is low.

Figure 6B:
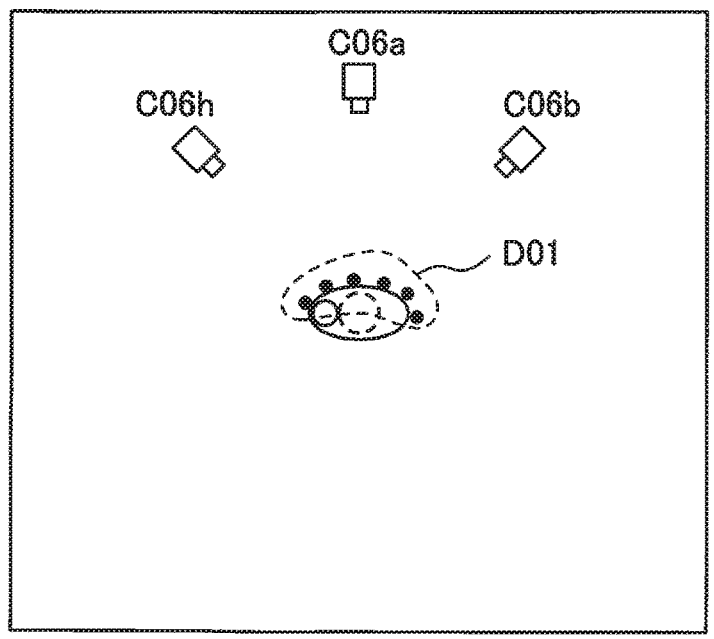
FIG. 6B is a second explanatory view of a temporary model.
Figure 6C:
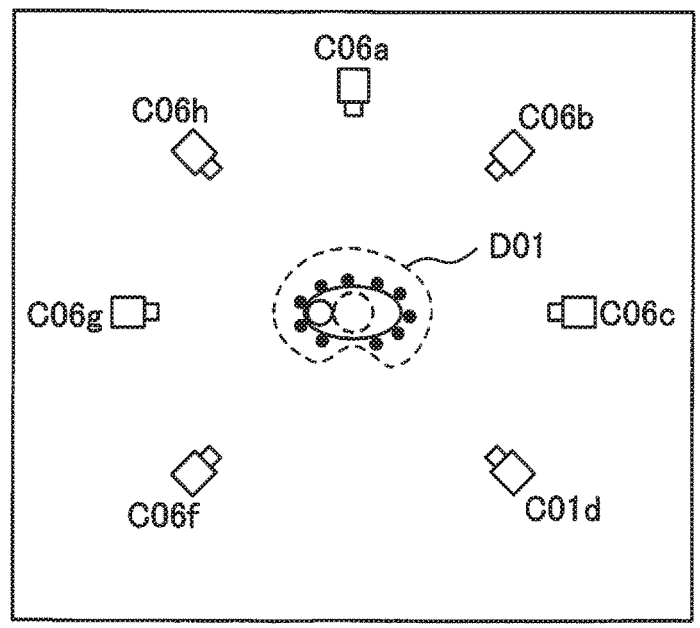
FIG. 6C is a third explanatory view of a temporary model.
Figure 6D:
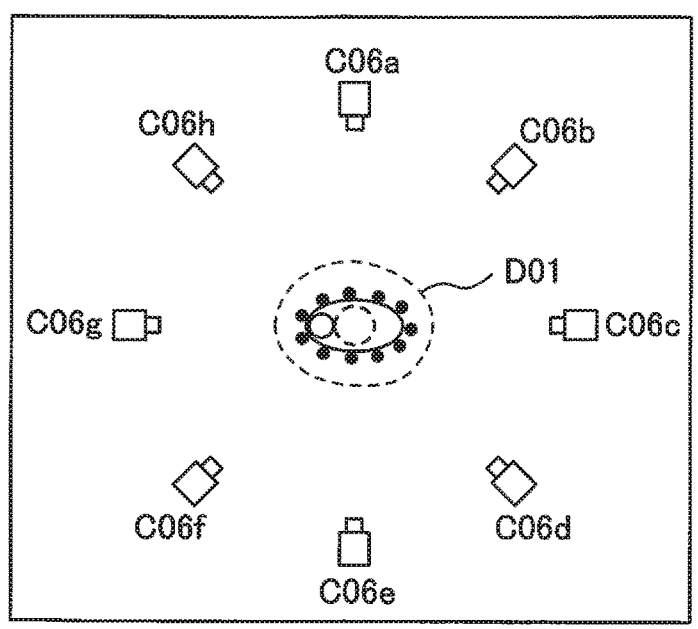
FIG. 6D is a fourth explanatory view of a temporary model.

Thus, as shown in FIG. 6B, objects measured from virtual measuring positions close to the virtual measuring position C06a, for example, the measuring positions C06b and C06h, are sequentially detected. Repeating such an operation causes the temporary model D01 to gradually expand as can be seen from FIGS. 6B and 6C. Finally, as shown in FIG. 6D, an object measured from the virtual measuring position C06e is detected, and then the model measurement data of the object is integrated in step S107. Thus, the temporary model D01, on which the model measurement data B13 of all the virtual measuring positions C06a to C06h are reflected, can be created.

In other words, in the present invention, objects are detected in order from one of the objects, which can be most accurately and stably detected, so that the temporary model D01 expands. Thus, the model measurement data B13 can be finally extracted from and integrated into a surface of an object, in which no model measurement data B13 are present in the initial virtual model.

When the detection is failed in step S105, there are no remaining objects A06, and accordingly, the process shifts to step S108. In step S108, the temporary model D01, in which the integration has been finished, is optimized to generate the three-dimensional model B40.

In the process described above, estimation parameters used to generate a three-dimensional model are the virtual measuring positions C06 (including orientation information) and the position of each three-dimensional point belonging to the temporary model D01. In step S108, a more accurate three-dimensional model can be generated by setting all these parameters to be estimated, and finding a solution at which the sum of matching errors (minimum square error) is minimized.

For example, an optimizing method generally known as bundle adjustment can be adopted. In the bundle adjustment, non-linear optimization is performed by a numerical analysis. As initial values in this operation, the previously detected virtual measuring positions C06 and three-dimensional points belonging to the temporary model D01 can be used. As seen above, a more accurate three-dimensional model B40 can be generated by optimizing the virtual measurement positions and the positions of three-dimensional points belonging to the temporary model D01 after the integration of the model measurement data B13 into the temporary model D01 is complete.

As seen above, in the present invention, three-dimensional models to be used for, for example, calculation of the position and orientation of objects can be generated for objects A06 having no CAD data. In the present invention, when three-dimensional models of the objects A06 are generated using the three-dimensional measuring machine A04, measurement data of a plurality of objects disposed at given orientations are treated as a set of model measurement data obtained by measuring one object from a plurality of virtual measurement positions. Thus, in the present invention, measuring an object one time using the three-dimensional measuring machine A04 enables generation of a three-dimensional model.

However, in another embodiment, three-dimensional measurement may be performed two or more times. When the three-dimensional measurement is performed again, it is only required that the process returns to step S101 without shifting to step S108 after failing in detection in step S105, and then objects are rearranged, and the subsequent process is repeated.

When, for example, only a small number of objects A06, e.g., two objects A06 are disposed within a measuring range of the three-dimensional measuring machine A04, it is difficult to generate a three-dimensional model, which is the same as the three-dimensional model obtained by measuring an object from various virtual measuring positions, by performing three-dimensional measurement one time. However, repeating an operation for measuring the two objects after rearranging them enables generation of a three-dimensional model of each object, which is similar to the three-dimensional model obtained by measuring the object from various measuring positions. Even in such a case, the three-dimensional model can be generated in a shorter time in comparison with the case that one object is measured while its orientation is changed little by little.

In this embodiment, it is difficult to extract the model measurement data B13, by calculation, from the measurement data including data obtained by measuring a plurality of objects having unknown three-dimensional models. When an operator teaches extraction of all the model measurement data, a load on the operator is too heavy. Thus, in the present invention, as described above, the temporary model D01 is taught, and the temporary model D01 is used to detect the positions and orientations of the remaining objects, and then the model measurement data B13 are extracted based on the detection results, and are integrated into the temporary model D01. Thus, the three-dimensional model can be generated without a heavy load on the operator.

In the meantime, operating, for example, an operation switch (not shown), to input a handling starting command for the objects A06 causes the object transferring operation shown on the right side of FIG. 5 to start. In step S201 in FIG. 5, a plurality of objects A06 disposed in a three-dimensional space are three-dimensionally measured. This process is substantially identical to the process of step S102.

Subsequently, the process shifts to step S202, and then one of the objects A06 disposed in a three-dimensional space is detected. This process is substantially identical to the process of step S104. When the detection of one object A06 is complete, the process shifts to step S203.

Further, an object's position and orientation calculating unit B20 checks the three-dimensional model B40, which is previously generated by the model generating unit B10, against the measurement data B30 of one of the objects A06, which are separately measured as described above, to calculate a position and posture B50 of each object A06.

Any method can be adopted as long as it is a method for checking the three-dimensional model against the measurement data, to calculate the positions and orientations of the objects A06. For example, three-dimensional characteristics, such as PPF (Point Pair Feature) feature amount or SHOT (Signature of Histogram of Orientation) feature amount, are calculated from the model point of the three-dimensional model. The three-dimensional characteristics are also calculated from the measurement data. Then three-dimensional points having the same feature amount may be searched from the measurement data, to calculate the position and orientation from these points.

Alternatively, the coordinates of three-dimensional points constituting the three-dimensional model are converted within a predetermined search position range or search orientation range, and differences with the three-dimensional points of the measurement data are found. If there are three-dimensional points having differences not greater than a predetermined value, such three-dimensional points of the three-dimensional model are counted as having no differences. This process is executed in three-dimensional points, which can be expected to be measured within the three-dimensional model, and, when the number of three-dimensional points having no differences is not less than a predetermined number, the position and orientation at that time may be output as a calculation result.

In the present invention, in comparison with a position and orientation calculation device using CAD data, the three-dimensional measuring machine A04, which actually measures objects, is used to create a three-dimensional model. Thus, discrepancies between the three-dimensional model and the measurement data when the position and orientation are calculated are hard to occur.

Subsequently, in step S203, the robot A01 is controlled so as to move the hand A03 of the robot A01 to a position corresponding to the position and orientation of one of the objects A06 detected in step S202. Then the hand A03 grasps the object A06, and the robot A01 performs a predetermined handling operation. When the handling operation for the object A06 is complete, the object transferring operation ends.

As seen above, in the present invention, even when the objects A06 are objects having no CAD data, the position and orientation of each object A06 disposed in a three-dimensional space can be calculated, and the objects A06 can be accurately handled based on the calculation results.

Further, the objects A06 are three-dimensionally measured to generate a three-dimensional model of each object A06, and accordingly, the time and effort for teaching at the time of generating the three-dimensional model can be drastically reduced.

Alternatively, in step S203, a reference robot's position and orientation with respect to a reference object's position and orientation that serves as a reference of the position and orientation of an object is previously stored in the robot control device A02. Subsequently, the robot's position and orientation, which coincides with the relative positional relationship between the reference object's position and orientation and the reference robot's position and orientation, is found with respect to the position and orientation of one of the objects A06 recognized in step S202. The robot A01 may be controlled so as to move the hand A03 to the robot's position and orientation.

In the present embodiment, the system ends after one object A06 is detected and then grasped and transferred. However, the positions and orientations of a plurality of objects A06 may be calculated based on a single detection, and the detected objects A06 may be successively grasped and transferred. Alternatively, all objects disposed in a three-dimensional space may be sequentially transferred. Note that, when objects are handled, as disclosed in Japanese Unexamined Patent Publication (Kokai) No. 2002-331480, interference of the hand A03 with a box containing the objects A06 may be avoided.

Effect of the Invention

In the first aspect of the invention, even for an object having no CAD data, a three-dimensional model to be used for, for example, calculation of a position and orientation of the object can be generated. When a three-dimensional model of an object is generated using the three-dimensional measuring machine, the measurement data of a plurality of objects each disposed at a given orientation are treated as a set of model measurement data obtained by measuring one object from a plurality of virtual measurement positions. Thus, the three-dimensional model can be generated by a single measurement.

In the second aspect of the invention, a temporary model is first taught from the measurement data of one object, and the temporary model is used to detect the positions and orientations of the remaining objects, and then model measurement data are extracted based on the detection results, and are integrated into the temporary model. Thus, a three-dimensional model can be generated without increase of a load on an operator.

In the third aspect of the invention, objects are detected in order from one of the objects, which has an orientation most close to an initial orientation of the temporary model, and the model measurement data are extracted and are successively integrated into the temporary model. In other words, objects are detected in order from one of the objects, which can be most accurately and stably detected, so that the temporary model expands. Thus, the model measurement data can be finally extracted and integrated into a surface of an object, in which no model measurement data are present in the initial temporary model.

In the fourth aspect of the invention, an operator instructs success and failure of the detection results obtained using the temporary model, so that wrong model measurement data can be prevented from being added to the three-dimensional model.

In the fifth aspect of the invention, when the model measurement data are extracted based on the detection results obtained using the temporary model, points in the vicinity of the existing model measurement data are extracted as new model measurement data. Thus, the time and effort for teaching are not necessary, and model measurement data can be automatically extracted.

In the sixth aspect of the invention, even when wrong three-dimensional points are included in the model measurement data, and are integrated into the temporary model, the consistency between the temporary model and the measurement data is confirmed to remove the incorrectly integrated model measurement data. This enables generation of a correct three-dimensional model.

In the seventh aspect of the invention, when the newly extracted model measurement data are integrated into the temporary model, if there are overlapped three-dimensional points between the model measurement data and the temporary model, integration of the overlapped three-dimensional points is avoided. Thus, the three-dimensional model is prevented from having heavy data, and can be generated so as to have an appropriate amount of information.

In the eighth aspect of the invention, when the newly extracted model measurement data are integrated into the temporary model, if there are overlapped three-dimensional points between the model measurement data and the temporary model, new three-dimensional points are calculated from the overlapped three-dimensional points, to update the temporary model. Thus, the three-dimensional model is prevented from having heavy data, and can be generated so as to have an appropriate amount of information. Further, the three-dimensional model, in which measuring errors are relaxed, can be generated.

In the ninth aspect of the invention, a more accurate three-dimensional model can be generated by optimizing the virtual measurement positions and the position of each three-dimensional point belonging to the model measurement data after the integration of the model measurement data is complete.

In the tenth aspect of the invention, even when the number of objects, which can be measured at one time, is small, a three-dimensional model is generated by performing a three-dimensional measurement two or more times and using a plurality of measurement data. This also enables generation of a three-dimensional model which can be obtained by measuring an object from various measurement positions. In these cases, the three-dimensional model can be generated in a shorter time in comparison with the case that one object is measured while its orientation is changed little by little.

In the eleventh aspect of the invention, even for an object having no CAD data, the position and orientation of the object can be calculated. Further, a three-dimensional model can be generated by measuring an object using the three-dimensional measuring machine, and accordingly, the time and effort for teaching at the time of generating the three-dimensional model can be drastically reduced. Further, in comparison with a position and orientation calculation device using CAD data, the three-dimensional measuring machine, which actually measures objects, is used to create the three-dimensional model. Thus, discrepancies between the three-dimensional model and the measurement data when the position and orientation are calculated are hard to occur.

In the twelfth aspect of the invention, even for an object having no CAD data, the position and orientation of the object disposed in a three-dimensional space can be calculated, and the object can be accurately handled based on the calculation results. Further, a three-dimensional model of the object is generated by three-dimensionally measuring the object, and accordingly, the time and effort for teaching at the time of generating the three-dimensional model can be drastically reduced.

The present invention has been described above using exemplary embodiments. However, a person skilled in the art would understand that the aforementioned modifications and various other modifications, omissions, and additions can be made without departing from the scope of the present invention.

What is claimed is:

1. A model generating device for generating a three-dimensional model of an object, the model generating device comprising:
  a three-dimensional measuring machine configured to obtain measurement data by three-dimensionally measuring a plurality of objects each disposed at a given orientation in a three-dimensional space; and
  a controller configured to:
    create a set of model measurement data for one object by using the measurement data of each object of the plurality of objects simultaneously measured by the three-dimensional measuring machine as virtual measurements of the one object measured from a plurality of virtual measurement positions,
    extract model measurement data corresponding to the plurality of virtual measurement positions, and
    integrate the extracted model measurement data, to generate a three-dimensional model of each object among the plurality of objects,
  wherein positions of the plurality of the objects are calculated based on the correspondence between the generated three-dimensional model and the measurement data obtained by the three-dimensional measuring machine,
  wherein the controller is further configured to:
    output the measurement data on a teaching screen on which
      images of the plurality of objects captured by the three-dimensional measuring machine are displayed, and
      the measurement data are superimposed on the displayed images,
    set a region surrounding the one object selected from the plurality of objects on the teaching screen on which the measurement data are output,
    generate a temporary model based on
      measurement data which are present within the set region, and
      the model measurement data measured from the virtual measuring positions corresponding to the object, and
    detect positions and orientations of the remaining objects of the plurality of objects using the temporary model, wherein the positions and orientations of the remaining objects correspond to the virtual measuring positions, and
  wherein the controller is further configured to:
    define a triangle patch, by a general triangle patch generating method, from three three-dimensional points acquired as the measurement data for an object among the plurality of objects,
    define a triangular pyramid from four points including the three-dimensional measuring machine and the three three-dimensional points, and in response to a model measurement datum being found within the triangular pyramid,
determine that the model measurement datum is incorrect included in the model measurement data, and
removing the incorrect model measurement datum from the model measurement data.

2. The model generating device according to claim 1, wherein
the controller is further configured to:
extract model measurement data based on the detected positions and orientations of the remaining objects, and
integrate the model measurement data into the temporary model, to generate a three-dimensional model.

3. The model generating device according to claim 2, wherein
the controller is further configured to
detect the remaining objects in order from an object having an orientation closest to an initial orientation of the temporary model,
extract model measurement data from the remaining objects in order from the object having the orientation closest to the initial orientation of the temporary model, based on detection results of the controller, and
successively integrate the model measurement data into the temporary model every time the model measurement data are extracted.

4. The model generating device according to claim 2, wherein
the controller is further configured to receive success and failure instructions from an operator who instructs success and failure of the detection results of the controller.

5. The model generating device according to claim 2, wherein
the controller is further configured to extract the model measurement data based on the measurement data in the vicinity of the positions and orientations of the remaining objects detected by controller.

6. The model generating device according to claim 2, wherein
when the controller integrates the model measurement data into the temporary model, if there is an overlapped portion between the model measurement data and the temporary model, after the overlapped portion is removed from the model measurement data, the model measurement data are integrated into the temporary model.

7. The model generating device according to claim 2, wherein
when the controller integrates the model measurement data into the temporary model, if there is an overlapped portion between the model measurement data and the temporary model, the overlapped portion of the temporary model is updated based on the overlapped portion of the model measurement data.

8. The model generating device according to claim 2, wherein
the controller is configured to perform optimization using, as a parameter, at least one of the virtual measurement positions calculated from the positions and orientations of the remaining objects detected by the controller or the model measurement data, to improve the accuracy of the three-dimensional model to be generated.

9. The model generating device according to claim 1, wherein
the three-dimensional measuring machine is configured to perform, one or more times, a process in which, after the plurality of objects disposed in a three-dimensional space are three-dimensionally measured, the loading condition of the plurality of objects is changed, and the plurality of objects are newly three-dimensionally measured, and
the controller is configured to generate a three-dimensional model of each object based on a plurality of measurement data obtained by performing a three-dimensional measurement two or more times.

10. A position and orientation calculating device, comprising:
the model generating device according to claim 1; and
a second controller configured to calculate the positions of the plurality of objects based on the correspondence between the three-dimensional model generated by the model generating device and the measurement data obtained by the three-dimensional measuring machine.

11. A handling robot device, comprising:
a robot;
the model generating device according to claim 1; and
a second controller configured to calculate the positions of the plurality of objects based on the correspondence between the three-dimensional model generated by the model generating device and the measurement data obtained by the three-dimensional measuring machine, wherein
the robot is configured to handle the plurality of objects based on the positions of the plurality of objects, which are calculated by the second controller.

12. The model generating device according to claim 1, wherein
the measurement data of the plurality of objects are obtained from a single capturing by the three-dimensional measuring machine.

13. The model generating device according to claim 1, wherein
the measurement data of a portion of an object among the plurality of objects is integrated with the measurement data of another portion of another object among the plurality of objects to obtain the set of model measurement data of the one object, and the set of model measurement data of the one object is applicable to all objects among the plurality of objects.

14. The model generating device according to claim 1, wherein
the measurement data of the plurality of objects are obtained from a single capturing by the three-dimensional measuring machine, and
the measurement data of a portion of an object among the plurality of objects is integrated with the measurement data of another portion of another object among the plurality of objects to obtain the set of model measurement data of the one object, and the set of model measurement data of the one object is applicable to all objects among the plurality of objects.

15. A model generating device for generating a three-dimensional model of an object, the model generating device comprising:
a three-dimensional measuring machine configured to obtain measurement data by three-dimensionally measuring a plurality of objects each disposed at a given orientation in a three-dimensional space; and
a controller configured to:

create a set of model measurement data for one object by using the measurement data of each object of the plurality of objects simultaneously measured by the three-dimensional measuring machine as virtual measurements of the one object measured from a plurality of virtual measurement positions, extract model measurement data corresponding to the plurality of virtual measurement positions, and integrate the extracted model measurement data, to generate a three-dimensional model of each object among the plurality of objects, wherein orientations of the plurality of the objects are calculated based on the correspondence between the generated three-dimensional model and the measurement data obtained by the three-dimensional measuring machine, wherein the controller is further configured to:
output the measurement data on a teaching screen on which
images of the plurality of objects captured by the three-dimensional measuring machine are displayed, and
the measurement data are superimposed on the displayed images,
set a region surrounding the one object selected from the plurality of objects on the teaching screen on which the measurement data are output,
generate a temporary model based on
measurement data which are present within the set region, and
the model measurement data measured from the virtual measuring positions corresponding to the object, and
detect positions and orientations of the remaining objects of the plurality of objects using the temporary model, wherein the positions and orientations of the remaining objects correspond to the virtual measuring positions, and wherein the controller is further configured to:
define a triangle patch, by a general triangle patch generating method, from three three-dimensional points acquired as the measurement data for an object among the plurality of objects, define a triangular pyramid from four points including the three-dimensional measuring machine and the three three-dimensional points, and in response to a model measurement datum being found within the triangular pyramid,
determine that the model measurement datum is incorrect included in the model measurement data, and
removing the incorrect model measurement datum from the model measurement data.

16. The model generating device according to claim 15, wherein
the controller is further configured to:
extract model measurement data based on the detected positions and orientations of the remaining objects, and
integrate the model measurement data into the temporary model, to generate a three-dimensional model.

17. The model generating device according to claim 15, wherein
the measurement data of the plurality of objects are obtained from a single capturing by the three-dimensional measuring machine.

18. The model generating device according to claim 15, wherein
the measurement data of a portion of an object among the plurality of objects is integrated with the measurement data of another portion of another object among the plurality of objects to obtain the set of model measurement data of the one object, and the set of model measurement data of the one object is applicable to all objects among the plurality of objects.

19. The model generating device according to claim 15, wherein
the measurement data of the plurality of objects are obtained from a single capturing by the three-dimensional measuring machine, and
the measurement data of a portion of an object among the plurality of objects is integrated with the measurement data of another portion of another object among the plurality of objects to obtain the set of model measurement data of the one object, and the set of model measurement data of the one object is applicable to all objects among the plurality of objects.

* * * * *